United States Patent [19]

Urakawa

[11] Patent Number: 5,331,233
[45] Date of Patent: Jul. 19, 1994

[54] SENSE AMPLIFIER CIRCUIT FOR REDUCING TRANSMISSION DELAY IN DATA LINE

[75] Inventor: Yukihiro Urakawa, Kawasaki, Japan

[73] Assignee: Kabushiki Kaisha Toshiba, Kawasaki, Japan

[21] Appl. No.: 891,965

[22] Filed: May 26, 1992

[30] Foreign Application Priority Data

May 27, 1991 [JP] Japan ................................ 3-121353

[51] Int. Cl.⁵ .......................... H03F 3/45; G11C 7/02; G11C 7/06; G01R 19/155
[52] U.S. Cl. ................................ 307/530; 307/355; 307/555; 307/491; 365/190
[58] Field of Search .............. 307/530, 355, 540, 555, 307/491; 365/190, 204, 207, 189.06

[56] References Cited

U.S. PATENT DOCUMENTS

| | | | |
|---|---|---|---|
| 4,479,202 | 10/1984 | Uchida | 365/190 |
| 4,606,012 | 8/1986 | Koshizuka | 307/530 |
| 4,739,198 | 4/1988 | Maruyama | 307/530 |
| 4,939,693 | 7/1990 | Tran | 365/207 |
| 4,948,993 | 8/1990 | Chin et al. | 307/530 |

FOREIGN PATENT DOCUMENTS 3-52194  3/1991  Japan.
60-34294 8/1991  Japan.

OTHER PUBLICATIONS

K. Ogiue et al., 13-ns, 500-mW, 64-kbit ECL RAM Using HI-BICMOS Technology, IEEE Journal of Solid-State Circuits, vol. SC-21, No. 5, Oct. 1986, pp. 681-685.

M. Takada et al., A 5-ns 1-Mb ECL BiCMOS SRAM, IEEE Journal of Solid-State Circuits, vol. 25, No. 5, Oct. 1990, pp. 1057-1062.

R. A. Kertis et al., A 12ns 256K BiCMOS SRAM, 1988 IEEE International Solid-State Circuits Conference.

*Primary Examiner*—John Zazworsky
*Attorney, Agent, or Firm*—Finnegan, Henderson, Farabow, Garrett & Dunner

[57] ABSTRACT

A plurality of differential amplifier circuits are supplied with respective potentials of a plurality of paired bit lines and subjects the potentials of the bit line pairs to the differential amplification. The plurality of differential amplifier circuits are connected to paired data lines. The paired data lines are connected at one end to a first clamping circuit for clamping the potential of the paired data lines. The first clamping circuit is connected to a common load circuit acting as a common load for the plurality of differential amplifier circuits. The paired data lines are connected at the other end to a second clamping circuit for reducing the amplitude of a voltage between the paired data lines.

19 Claims, 5 Drawing Sheets

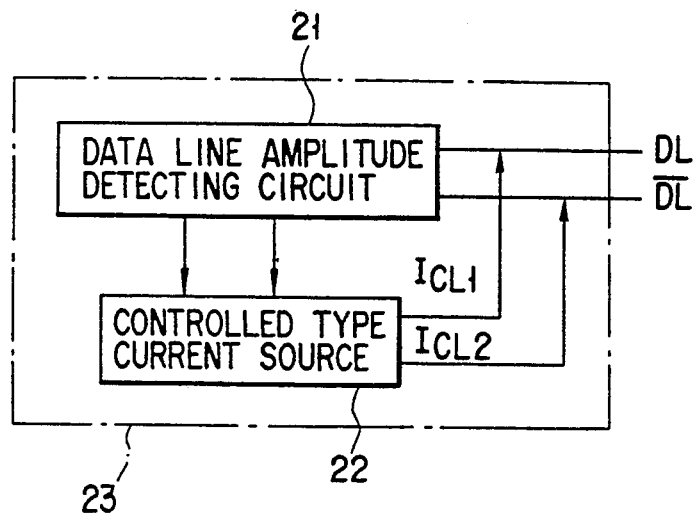
F I G. 1
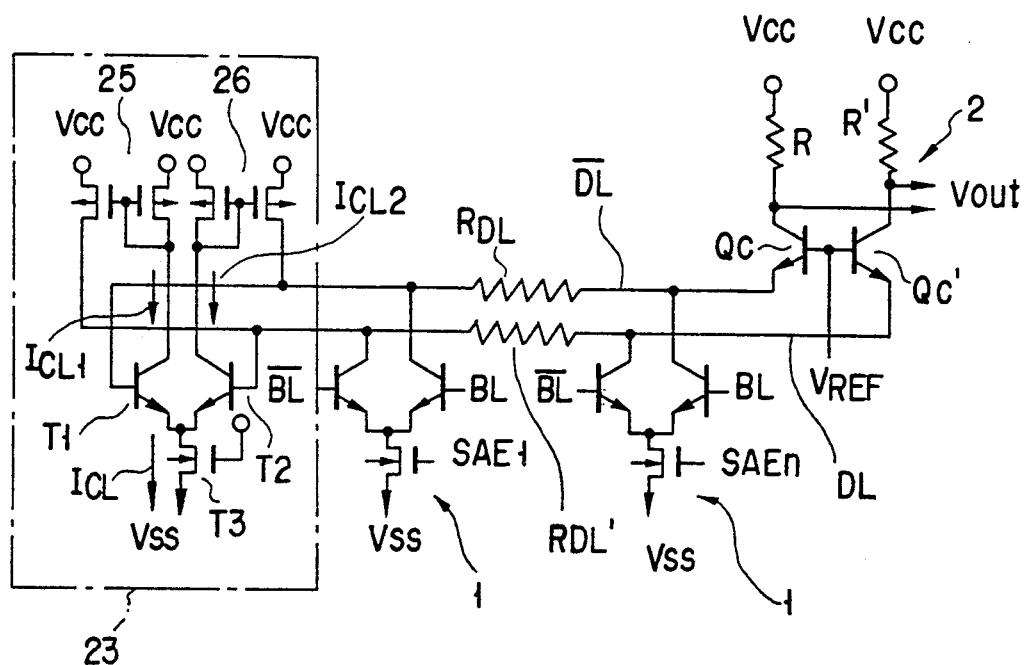
F I G. 2

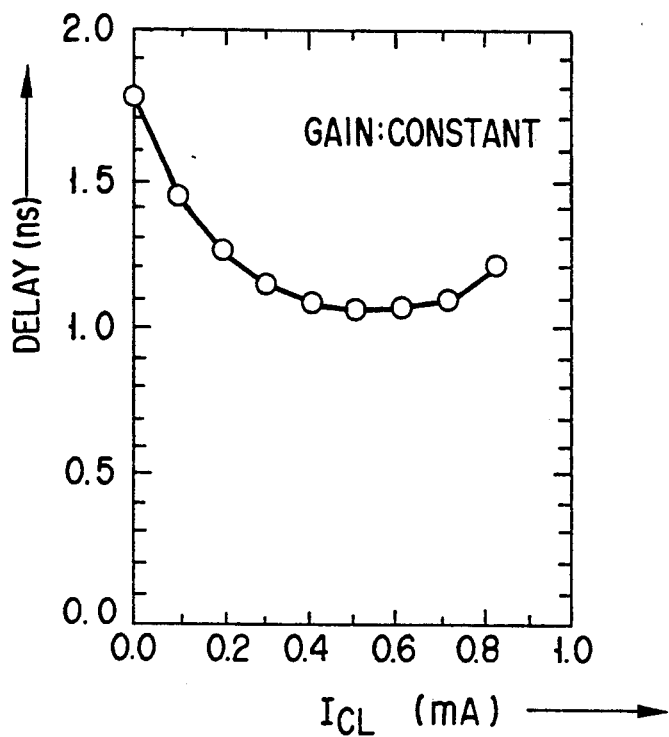
F I G. 3
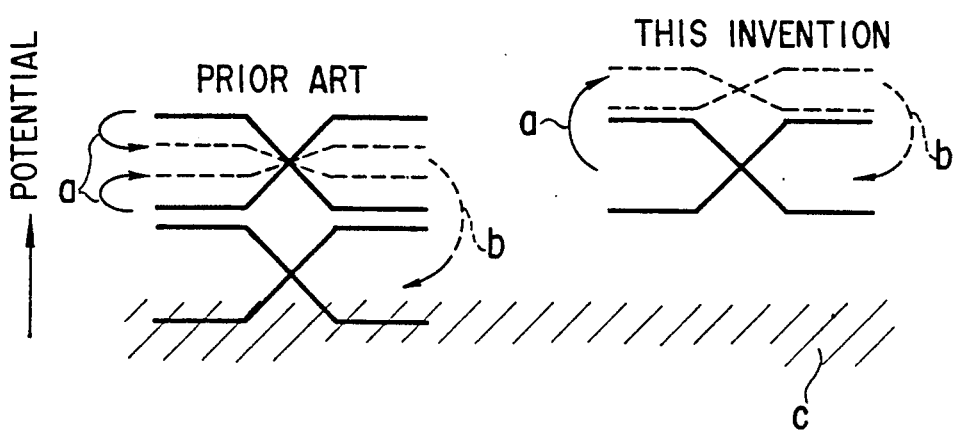
F I G. 4

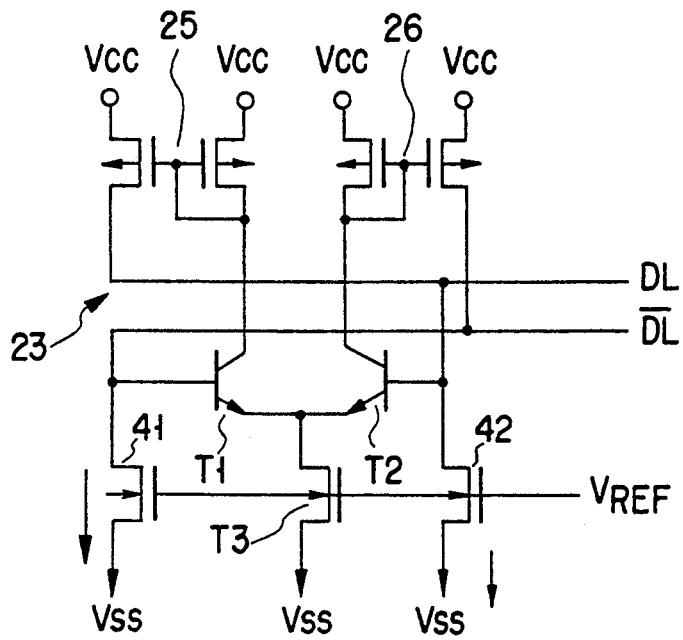
F I G. 5
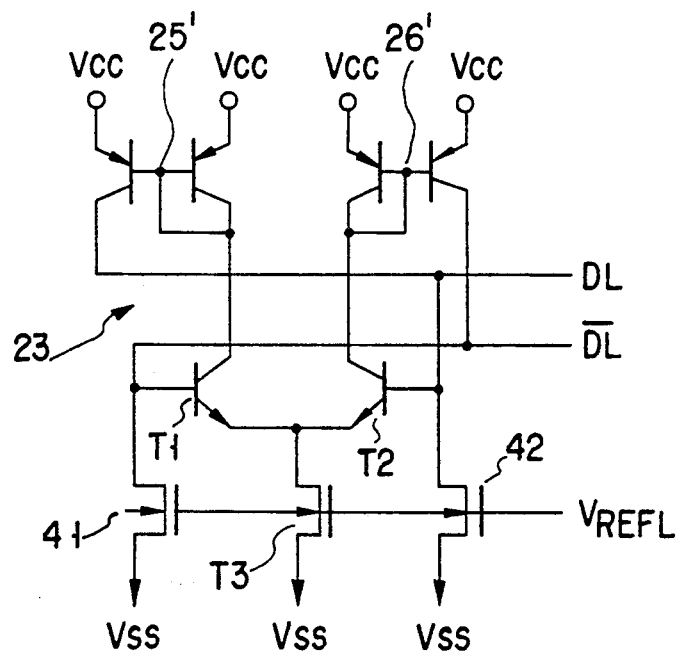
F I G. 6

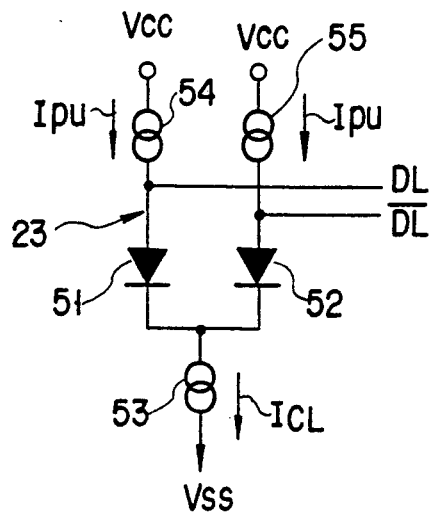
F I G. 7
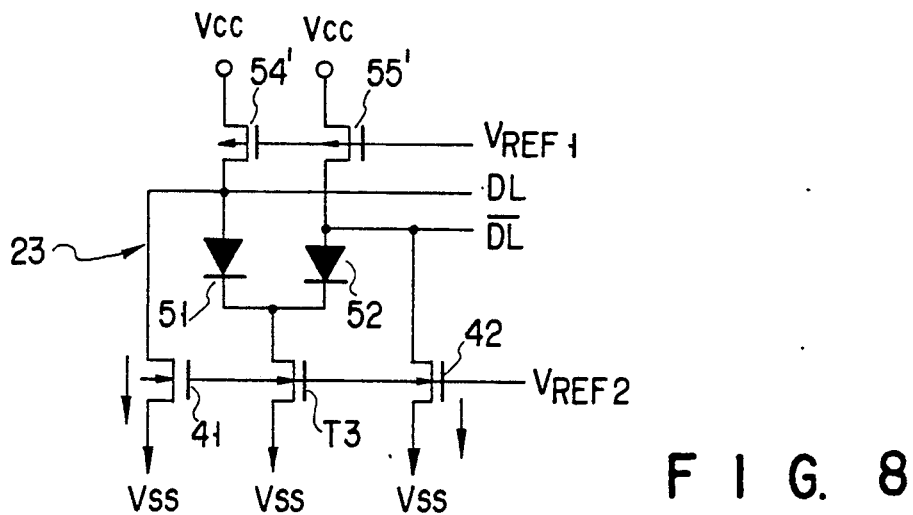
F I G. 8
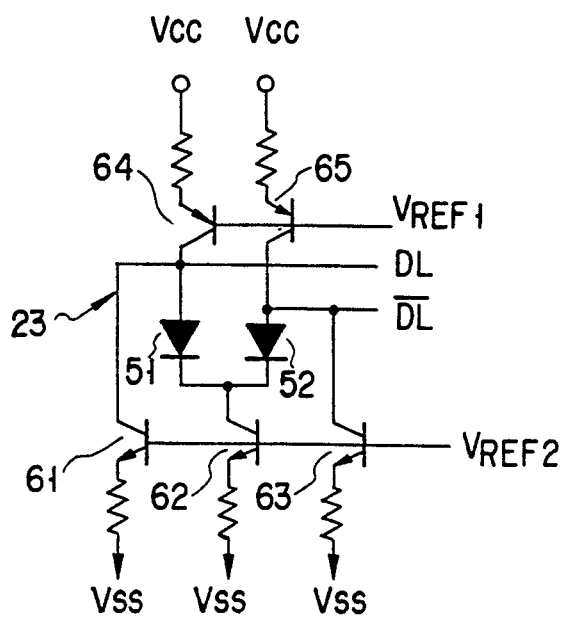
F I G. 9

SENSE AMPLIFIER CIRCUIT FOR REDUCING TRANSMISSION DELAY IN DATA LINE

BACKGROUND OF THE INVENTION

1. Field of the Invention

This invention relates to a sense amplifier circuit, and more particularly to a current detecting type sense amplifier circuit for amplifying data read out from a memory cell.

2. Description of the Related Art

Conventionally, a current detecting type sense amplifier is used as a sense amplifier circuit for bipolar memories or Bi-CMOS (bipolar-complementary MOS) memories. This type of sense amplifier circuit is disclosed in Japanese Patent Publication No. 60-34294, for example. In such a sense amplifier circuit as is disclosed in the above Patent Publication, since the amplitude of a voltage occurring between paired data lines at the time of readout of stored data from a memory cell is relatively small, a readout current can be transmitted to a load section without substantially driving a parasitic capacitor of the data line pair. Therefore, it becomes possible to suppress the delay in data transfer caused by the charging and discharging operations of the parasitic capacitor of the data line pair.

However, with an increase in the memory capacity in recent years, the data line is formed thinner and longer so that the parasitic resistance of the data line may tend to become larger. As the parasitic resistance of the data line increases, the amplitude of a voltage occurring between paired data lines at the time of readout of stored data becomes larger, causing a relatively large delay in the data line section.

In order to solve the above problem, various types of sense amplifiers have been proposed to improve the delay characteristic in the data line section. One of them is proposed by the inventor of this invention and disclosed in Japanese Patent Disclosure No. 3-52194. In a sense amplifier circuit disclosed in the above Patent Disclosure, the data line pair is formed in a hierarchical structure (the data line pair is divided into first- and second level data line pairs and a readout current transmission circuit is formed between the first- and second-level data line pairs) to reduce the length of the data line on each level. With the above structure, since the length of the first-level data line pair can be reduced and the parasitic resistance and parasitic capacitance can be reduced, the delay in the data line can be significantly reduced. Further, since the wiring length of the second-level data line can be reduced by adequately arranging the second-level data line, the wiring resistance thereof can be reduced. In addition, since the collector capacitor of a bipolar transistor used in the readout current transmission circuit is simply provided for each transmission circuit, the data line capacitor can be made relatively small. As a result, since the delay in the second-level data line section can be reduced, the total delay in the entire data line can be significantly improved. Further, it is only required to activate only one of a plurality of emitter-coupled differential pairs connected to a plurality of first-level data line pairs even though the data line pairs are formed in the hierarchical structure, the current consumption in the differential amplifier may be made substantially the same as that in the prior art.

However, in the circuit system disclosed in the above Patent Disclosure, since two reference potentials are required and bipolar circuits of three stages are series-connected, the power source voltage margin may be deteriorated by an amount corresponding to the base-emitter voltage (forward voltage Vf of a diode) of a bipolar transistor used in the readout current transmission circuit in comparison with the conventional circuit system. Particularly, in a Bi-CMOS memory or the like using a circuit of miniaturized CMOS structure, the power source voltage tends to be lowered, but in this case, the sense amplifier circuit of a type disclosed in the above Patent Disclosure cannot be used.

A sense amplifier disclosed in IEEE JOURNAL OF SOLID-STATE CIRCUITS. VOL. 25, NO. 5, OCTOBER 1990 pp 1057 to 1062 is known as another means for solving the above problem. The sense amplifier circuit disclosed in the above article has a feature that a resistor is connected between the paired data lines of the conventional current detecting type sense amplifier circuit and a by-pass current is supplied to the resistor to equalize the paired data lines. With this feature, a difference between currents flowing in the paired data lines is reduced and the delay in the data line section becomes small. That is, the amplitude of a voltage between the paired data lines can be reduced by increasing the conductance of the resistor connected between the paired data lines, thereby increasing the by-pass current flowing in the resistor. However, at this time, a problem that the output amplitude of the sense amplifier becomes small occurs. In order to solve this problem, the resistance of a load resistor of a common load circuit may be increased. In this case, however, if the conductance of the resistor connected between the paired data lines is increased and the resistance of the load resistor of the common load circuit is increased, then a new problem that the bipolar transistor of the common load circuit is saturated occurs. This is because the total sum of the readout currents transmitted to the common load circuit is equal to the total current (the sum of the complementary currents) always flowing in the sense amplifier circuit. Therefore, it is impossible to excessively increase the conductance of the resistor connected between the paired data lines and the delay time in the data line section may not be significantly reduced.

SUMMARY OF THE INVENTION

Accordingly, an object of this invention is to provide a sense amplifier circuit for reducing the signal delay in the data line section without narrowing the power source voltage margin and operation margin.

The above object can be attained by a sense amplifier circuit comprising a plurality of differential amplifier circuits for receiving potentials of a plurality of pairs of bit lines at input terminals thereof and subjecting the potentials of the bit line pairs to the differential amplification; common load circuit acting as a common load for the plurality of differential amplifier circuits; paired data lines connected to the plurality of differential amplifier circuits; first clamping circuit connected between the common load circuit and the paired data lines, for clamping the potential of the paired data lines; and second clamping circuit for reducing the amplitude of a voltage between the paired data lines.

with the above construction, the amplitude of a voltage between the paired data lines can be reduced by means of the second clamping circuit provided for the data line pair and the time delay can be reduced. Further, the sense amplifier circuit can be formed in a structure other than the hierarchical structure, reduction in the power source voltage margin can be prevented. In addition, since electric power is supplied to the data line pair via the second clamping circuit, saturation of the transistor pair constituting the first clamping circuit can be prevented even if the load resistance of the common load circuit is increased in order to raise the output gain when the voltage amplitude of the data line pair is reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a block diagram showing a schematic construction of a clamping circuit connected to a sense amplifier circuit according to one embodiment of this invention, for illustrating the sense amplifier circuit;

FIG. 2 is a circuit diagram showing a sense amplifier circuit according to a first embodiment of this invention;

FIG. 3 is a diagram showing the relationship between the delay caused by the sense amplifier circuit on the assumption that a 1-M bit memory is used and a differential current flowing in paired bipolar transistors having emitters connected together in the clamping circuit;

FIG. 4 is a diagram showing the relationship between the output amplitudes of the conventional sense amplifier circuit and the sense amplifier circuit of this invention obtained when the resistance of the load resistor is increased together with the saturation region of the bipolar transistor pair in the common load circuit;

FIG. 5 is a circuit diagram showing another construction of the clamping circuit shown in FIG. 1, for illustrating a sense amplifier circuit according to a second embodiment of this invention;

FIG. 6 is a circuit diagram showing still another construction of the clamping circuit shown in FIG. 1, for illustrating a sense amplifier circuit according to a third embodiment of this invention;

FIG. 7 is a circuit diagram showing another construction of the clamping circuit shown in FIG. 1, for illustrating a sense amplifier circuit according to a fourth embodiment of this invention;

FIG. 8 is a circuit diagram showing a concrete construction of the clamping circuit shown in FIG. 7, for illustrating a sense amplifier circuit according to a fifth embodiment of this invention;

FIG. 9 is a circuit diagram showing another concrete construction of the clamping circuit shown in FIG. 7, for illustrating a sense amplifier circuit according to a sixth embodiment of this invention.

DETAILED DESCRIPTION OF THE PREFERRED EMBODIMENTS

Figure 10:
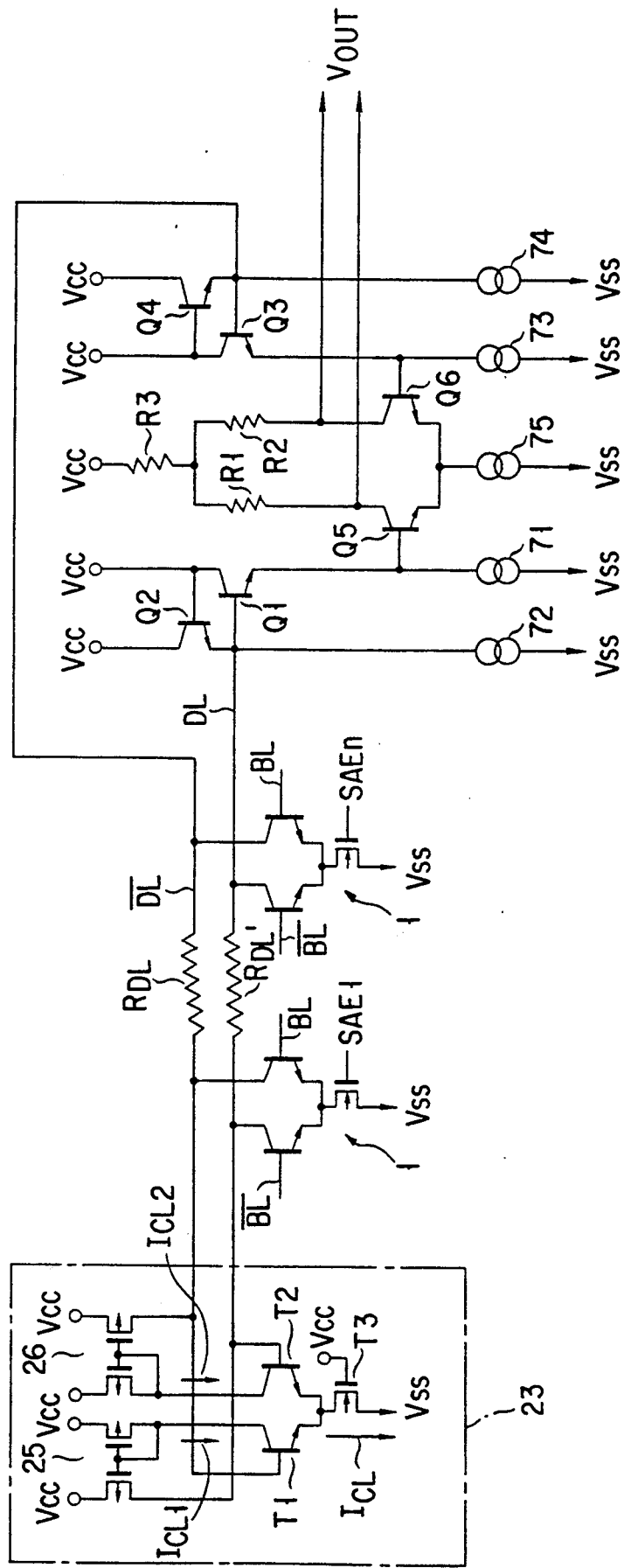
FIG. 10 is a circuit diagram showing a sense amplifier circuit according to a seventh embodiment of this invention.

FIG. 1 shows a schematic construction of a clamping circuit connected to a sense amplifier circuit according to one embodiment of this invention, for illustrating the sense amplifier circuit. FIG. 2 shows a concrete construction of the clamping circuit shown in FIG. 1 together with the whole construction of the sense amplifier. The clamping circuit 23 shown in FIG. 1 includes a data line amplitude detecting circuit 21 and a controlled type current source 22 to clamp the potentials of paired data lines DL and $\overline{DL}$. The data line amplitude detecting circuit 21 monitors the amplitude of a voltage between the data lines DL and $\overline{DL}$ and controls the controlled type current source circuit 22 so as to prevent the amplitude of a voltage between the data lines from being increased. The circuit 22 controls clamping currents $I_{CL1}$ and $I_{CL2}$ (the sum of them is equal to a clamping current $I_{CL}$) according to a signal from the circuit 21. That is, the clamping circuit 23 supplies a clamping current ($I_{CL1}$ or $I_{CL2}$) to reduce the data line current ($I_{DL}$ or $I_{\overline{DL}}$) so as to prevent the potential of one of the paired data lines which is lower than the other data line from being excessively lowered while monitoring the amplitude $\Delta V_{DL}$ of a voltage between the paired data lines. More specifically, a control operation is effected to supply a large amount of compensation (clamping) current into one of the paired data lines which is set at a lower potential (that is, one of the paired data lines in which a larger amount of readout current flows) and supply a small amount of compensation (clamping) current into one of the paired data lines which is set at a higher potential (that is, one of the paired data lines in which a smaller amount of readout current flows). Thus, the clamping circuit 23 can reduce the amount of data line current flowing in the data line pair and transmitted to the common load circuit (FIG. 2). As a result, the amplitude of a voltage between the paired data lines and the delay in the data line may be reduced.

As shown in FIG. 2, data read out from a memory cell (not shown) is supplied to the paired bit lines BL and $\overline{BL}$ as a potential difference of several tens mV ($=\Delta V_{BL}$) between the paired bit lines. The bases of each pair of NPN bipolar transistors $Q_D$ and $Q_D'$ constituting a corresponding one of a plurality of (n) differential amplifiers i are respectively connected to the bit lines BL and $\overline{BL}$. The emitters of the paired transistors $Q_D$ and $Q_D'$ are connected together and the collectors thereof are respectively connected to paired common data lines $\overline{DL}$ and DL. The transistors $Q_D$ and $Q_D'$ convert potential difference data output to the paired bit lines BL and $\overline{BL}$ into current difference data by the effect of the emitter coupling of the transistors $Q_D$ and $Q_D'$ and transmit the current difference data to the paired data lines DL and $\overline{DL}$. The source-drain path of each of N-channel MOSFETs (MOS transistors) $QN_1$ to $QN_n$ acting as a controlled type current source is connected between the emitter connection node of a corresponding pair of the transistors $Q_D$ and $Q_D'$ and the power source (ground) terminal Vss and the gates thereof are respectively supplied with control signals $SAE_1$ to $SAE_n$. Only one of n signals of $SAE_1$ to $SAE_n$ which corresponds to a selected bit line is activated (set into an "H" level or high level state) and the remaining signals are set into a deactivated state ("L" level state). Therefore, only data corresponding to the selected bit line is converted into current difference data by the activated differential amplifier 1.

Readout data converted into the current difference data by the differential amplifier 1 is supplied to a common load section 2 via the paired data lines DL and $\overline{DL}$. The common load section 2 includes a pair of load resistors R and R' (R'=R) and bipolar transistors $Q_C$ and QC'. One end of each of the load resistors R and R' is connected to a power source terminal $V_{CC}$. The bases of the bipolar transistors $Q_C$ and $Q_{C'}$ are commonly connected to a reference potential terminal $V_{REF}$, the emitters thereof are respectively connected to the data lines DL and $\overline{DL}$, and the collectors thereof are respectively connected to the other ends of the load resistors R and R'. Since the impedance of the bipolar transistor as viewed from emitter side is extremely low, the potentials of the data lines DL and $\overline{DL}$ are fixedly clamped to "$V_{REF}-V_f$ ($V_f$ is a forward voltage of a diode)" by means of the transistors $Q_C$ and $Q_{C'}$. Current difference data transmitted to the load resistor section is converted into a potential difference by the load resistors R and R' and output as an output signal (potential difference data) $V_{OUT}$.

The data lines DL and $\overline{DL}$ are connected to the clamping circuit 23 shown in FIG. 1. The clamping circuit 23 includes NPN bipolar transistors T1 and T2, N-channel MOSFET T3 acting as a current source, and current mirror circuits 25 and 26 constituted by P-channel MOSFETs. The bases of the transistors T1 and T2 are respectively connected to the data lines DL and $\overline{DL}$ and the emitters thereof are connected together. The current path of the transistor T3 is connected between the emitter connection node of the transistors T1 and T2 and the power source (ground) terminal $V_{SS}$. The collectors of the transistors T1 and T2 are respectively connected to the input terminals of the current mirror circuits 25 and 26 and the output terminals of the current mirror circuits 25 and 26 are respectively connected to the data lines DL and $\overline{DL}$. Thus, the input sides (bases) and the output sides (collectors) of the transistors T1 and T2 are cross-coupled via the current mirror circuits 25 and 26.

With the above construction, an increase in the amplitude of a voltage between the paired data lines caused by the data line current and data line resistance ($R_{DL}=R_{DL}'$) is detected by the transistors T1 and T2 and most part of the differential current $I_{CL}$ flows in the bipolar transistor which is connected to one of the data lines which is set to a higher data line potential (in which a smaller data line current flows). The current is echoed from the driver side to the data line whose data line potential is lower (whose data line current is larger) by means of the current mirror circuit 25 or 26. Therefore, the data line currents $I_{DL}$ and $I_{DL}'$ flowing through the paired data lines DL and $\overline{DL}$ and reaching the common load circuit 2 can be expressed by the following equations.

$$I_{DL} = \frac{I_{SA} \cdot \exp\left(\frac{\Delta V_{BL}}{V_T}\right)}{1 + \exp\left(\frac{\Delta V_{BL}}{V_T}\right)} - \frac{I_{CL} \cdot \exp\left(\frac{\Delta V_{DL}}{V_T}\right)}{1 + \exp\left(\frac{\Delta V_{DL}}{V_T}\right)}$$

-continued $$I_{DL}' = \frac{I_{SA}}{1 + \exp\left(\frac{\Delta V_{BL}}{V_T}\right)} - \frac{I_{CL}}{1 + \exp\left(\frac{\Delta V_{DL}}{V_T}\right)}$$

In the above equations, $I_{SA}$ indicates the total current flowing in the differential amplifier 1, $\Delta V_{BL}$ indicates the potential difference between the paired bit lines, $V_T$ indicates the thermal voltage (approx. 25 mA: room temperature) and $I_{CL}$ indicates the total sum of the clamping currents. As a result, the amplitude of a voltage between the paired data lines becomes small as indicated by the following equation.

$$\Delta V_{DL} = V_{BL} + \Delta I_{DLO} \cdot R_{DL} - I_{CL} \cdot R_{DL} \left\{ \frac{\exp\left(\frac{\Delta V_{DL}}{V_T}\right) - 1}{1 + \exp\left(\frac{\Delta V_{DL}}{V_T}\right)} \right\}$$

where $\Delta I_{DLO}$ indicates a difference between the data line current on the "L" level side and the data line current on the "H" level side, and RDL indicates a parasitic resistor of the data line. That is, like the conventional case (in the circuit disclosed in the IEEE article), in the case of this embodiment, the amplitude of a voltage between the paired data lines and the amplitude of an output signal $V_{OUT}$ of the sense amplifier are reduced with a decrease in the current flowing in the data line. In order to increase the amplitude of the output signal $V_{OUT}$, the resistances of the load resistors R and R' may be increased.

FIG. 3 shows the relation between the delay in the sense amplifier circuit and the emitter-coupled differential current $I_{CL}$ of the clamping circuit 23 on the assumption that a 1-M bit memory is used in the circuit of FIG. 2. That is, as the current $I_{CL}$ is increased, the delay in the sense amplifier circuit is reduced, but when the current $I_{CL}$ is increased to exceed a preset value, the CR delay caused by an increase in the resistances of the load resistors R and R' of the common load circuit 2 and the collector capacitances of the transistors $Q_C$ and $Q_C'$ becomes larger, thereby increasing the delay time. Therefore, there exists an optimum current value $I_{CL}$ and the sense delay can be reduced from 1.8 ns to 1.1 ns by 0.7 ns (39%) by selecting the optimum current value $I_{CL}$. Further, even if the resistances of the load resistors R and R' are increased in order to compensate for reduction in the output amplitude of the sense amplifier caused by reduction in the amplitude of the voltage between the paired data lines, no saturation occurs in the bipolar transistors $Q_C$ and $Q_C'$ unlike the circuit disclosed in the IEEE article. This case is shown in FIG. 4, and an arrow a indicates that the voltage amplitude is reduced by clamping and an arrow b indicates that the output amplitude which has been reduced is increased again by increasing the resistances of the load resistors R and R'. A hatched area c indicates a saturation region of the clamping bipolar transistor ($Q_C$ and Q'). That is, since the total sum of data line currents supplied to the common load circuit 2 of FIG. 2 is set to "$I_{SA}-I_{CL}$" and is thus reduced by a current in the differential section of the clamping circuit 23, the intermediate potential value of the output amplitude of the sense amplifier circuit is shifted in the upward direction as shown by the arrow a. This is essentially different from the conventional case (circuit disclosed in the IEEE article) in which the total sum of the data line currents is constant and the intermediate value of the output amplitude is kept unchanged. That is, there is a difference between the conventional circuit disclosed in the IEEE article in which a compensation current for reducing the amplitude of a voltage between the data lines is supplied to all of the data line pairs and this embodiment in which the data line is clamped as shown in FIG. 2 by supplying the data line clamping current from the clamping circuit 23. Therefore, even if resistances of the load resistors R and R' are increased in order to increase the amplitude of the output signal $V_{OUT}$, saturation of the transistors $Q_C$ and $Q_C'$ becomes difficult to occur since the output of the sense amplifier circuit of the construction shown in FIG. 2 has a large voltage (potential) amplitude (unlike the circuit disclosed in the IEEE article in which saturation tends to occur as shown in FIG. 4). There is an advantage that saturation of the transistors $Q_C$ and $Q_C'$ is difficult to occur even when the selected differential amplifier 1 is disposed near the common load circuit 2. Further, since the clamping circuit 23 is used and it becomes possible to accelerate the recovery of the data lines until data is inverted in a case where data of the data line pair is inverted, the sense delay can be significantly improved.

FIG. 5 shows another construction of the clamping circuit 23 shown in FIG. 1, for illustrating a second embodiment of this invention. The construction of this circuit is similar to that of the circuit of FIG. 2 except that idling constant current sources 41 and 42 are inserted between the data lines $\overline{DL}$ and DL and the power source (ground) terminal $V_{SS}$. In order to enhance the operation speed of the sense amplifier circuit and at the same time reduce the power consumption thereof, all of the emitter-coupled differential sections may be set in the OFF state at the time of non-selection of the chip or in the data writing mode. In this case, the potential of the common data line may be raised to an excessively high level by the clamping current and the readout speed at the next access time may be lowered. With this problem taken into consideration, pull-down idling currents are always supplied to the common data lines by means of the transistors 41 and 42.

FIG. 6 is a diagram for illustrating a third embodiment of this invention and shows an example in which the current mirror circuits 25 and 26 of the clamping circuit 23 are replaced by current mirror circuits 25' and 26' constructed by PNP bipolar transistors.

FIG. 7 is a circuit diagram for illustrating a fourth embodiment of this invention. A pair of diodes 51 and 52 whose cathodes are connected together and whose anodes are connected to a pair of data lines are provided, a constant current source 53 is connected between the cathode thereof and the ground terminal $V_{SS}$, and constant current sources 54 and 55 are connected between the anodes of the respective diodes and the power source terminal $V_{CC}$. With the above construction, an increase in the amplitude of a voltage between the data lines caused by the data line current and the data line resistance can be detected by the cathode-connected differential section and most part of the current $I_{CL}$ flows into the diode connected to one of the data lines which is set at a higher data line potential (whose data line current is smaller). As a result, the data line currents $I_{DL}$ and $I_{DL}'$ flowing in the paired data lines DL and $\overline{DL}$ and supplied to the common load circuit 2 can be expressed by the following equations.

$$I_{DL} = \frac{I_{SA} \cdot \exp\left(\frac{\Delta V_{BL}}{V_T}\right)}{1 + \exp\left(\frac{\Delta V_{BL}}{V_T}\right)} + \frac{I_{CL} \cdot \exp\left(\frac{\Delta V_{DL}}{V_T}\right)}{1 + \exp\left(\frac{\Delta V_{DL}}{V_T}\right)} - I_{pu}$$

(for the data line set at a lower data line potential)

$$I_{DL'} = \frac{I_{SA}}{1 + \exp\left(\frac{\Delta V_{BL}}{V_T}\right)} + \frac{I_{CL}}{1 + \exp\left(\frac{\Delta V_{DL}}{V_T}\right)} - I_{pu}$$

(for the data line set at a higher data line potential)

where Ipu indicates a current flowing in each of the current sources 54 and 55. As is clearly understood from the above equations, the amplitude of the voltage between the paired data lines is reduced by an amount of "current component of the second term x resistance of the data line." Therefore, the delay in the data line section can be improved in the same manner as in the case of the first embodiment shown in FIG. 2. In this embodiment, since the operation speed of restoring the clamping current after detection of the data line potential difference can be enhanced by an amount achieved by supplying the clamping current without passing through the mirror circuits shown in FIG. 2, an erroneous operation will become difficult to occur when data which is temporarily made unstable by the address skew or the like is output.

FIG. 8 is a circuit diagram showing a concrete construction of the circuit shown in FIG. 7, for illustrating a fifth embodiment of this invention. In this embodiment, P-channel MOSFETs 54' and 55' are used to constitute the constant current sources and a reference voltage $V_{REF1}$ is applied to the gates of the MOSFETs. Further, N-channel MOSFETs 41 and 42 acting as the idling current sources are used and a reference voltage $V_{REF2}$ is applied to the gates of the MOSFETs. In this respect, the circuit is the same as the circuits shown in FIGS. 5 and 6.

FIG. 9 is a circuit diagram showing another concrete construction of the circuit shown in FIG. 7, for illustrating a sixth embodiment of this invention. In this embodiment, constant current sources 61 to 65 are constituted by bipolar transistors.

FIG. 10 shows a sense amplifier circuit according to a seventh embodiment of this invention. In each of the above embodiments, a case wherein the pair of transistors $Q_C$ and $Q_C'$ constituting part of the common load circuit 2 are formed of the grounded-emitter type is explained, but in this embodiment, a pair of grounded-base type transistors are used. In FIG. 10, portions which are the same as those of the circuit shown in FIG. 2 are denoted by the same reference numerals and the explanation therefor is omitted.

The base of an NPN bipolar transistor Q1 and the emitter of an NPN bipolar transistor Q2 are connected to a data line DL. The collector of the transistor Q1 and the base and collector of the transistor Q2 are connected to a power source terminal $V_{CC}$. A constant current source 71 is connected between the emitter of the transistor Q1 and a ground terminal VSS, and a constant current source 72 is connected between the emitter of the transistor Q2 and the ground terminal $V_{SS}$. The base of an NPN bipolar transistor Q3 and the emitter of an NPN bipolar transistor Q4 are connected to a data line $\overline{DL}$. The collector of the transistor Q3 and the base and collector of the transistor Q4 are connected to the power source terminal $V_{CC}$. A constant current source 73 is connected between the emitter of the transistor Q3 and the ground terminal $V_{SS}$, and a constant current source 74 is connected between the emitter of the transistor Q4 and the ground terminal $V_{SS}$. The base of an NPN bipolar transistor Q5 is connected to the emitter of the transistor Q1. The base of an NPN bipolar transistor Q6 is connected to the emitter of the transistor Q3 and the emitter thereof is connected to the emitter of the transistor Q5. A constant current source 75 is connected between the emitter common connection node of the transistors Q5 and Q6 and the ground terminal VSS. The collectors of the transistors Q5 and Q6 are respectively connected to one-side ends of resistors R1 and R2. A resistor R3 is connected between the power source terminal $V_{CC}$ and the other ends of the resistors R1 and R2.

With the above construction, substantially the same operation as that of the circuit shown in FIG. 2 is effected and substantially the same effect can be obtained. Further, the clamping circuit 23 is not limited to the construction shown in FIG. 10, and various constructions as shown in FIGS. 5 to 9 can be used.

This invention is not limited to the above embodiments and can be variously modified. For example, the clamping circuit of this invention may be preferably arranged on the data line and in position farthest from the common load circuit 2. Further, it is possible to arrange a plurality of clamping circuits on the same data line.

As described above, according to this invention, a sense amplifier circuit in which the signal delay in the data line section can be reduced without degrading the power source voltage margin and operation margin can be provided.

What is claimed is:
1. A sense amplifier circuit comprising:
   a plurality of differential amplifier means for receiving potentials of a plurality of pairs of bit lines at input terminals thereof and subjecting the potentials of the bit line pairs to a differential amplification;
   common load means acting as a common load for said plurality of differential amplifier means;
   paired data lines connected to said plurality of differential amplifier means;
   first clamping means connected between said common load means and said paired data lines, for clamping the potentials of said paired data lines; and
   second clamping means for reducing the amplitude of a voltage between said paired data lines.

2. A sense amplifier circuit according to claim 1, wherein each of said plurality of differential amplifier means includes a first bipolar transistor having a collector connected to one of said paired data lines and a base connected to one of said bit lines of a corresponding pair; a second bipolar transistor having a collector connected to the other of said paired data lines, a base connected to the other of said bit lines of said corresponding pair and an emitter connected to an emitter of said first bipolar transistor; and a MOSFET having a current path connected between the emitters of said first and second bipolar transistors and a ground terminal and a gate supplied with a control signal.

3. A sense amplifier circuit according to claim 1, wherein said common load means includes a pair of load resistors.

4. A sense amplifier circuit according to claim 1, wherein said first clamping means includes a pair of bipolar transistors each having a collector-emitter path connected between said common load means and a corresponding one of said paired data lines and a base applied with a reference potential.

5. A sense amplifier circuit according to claim 1, wherein said second clamping means includes detection means for detecting the amplitude of a voltage between said paired data lines; and controlled type current source means for controlling an amount of current flowing in said paired data lines in response to an output of said detecting means to prevent the amplitude of the voltage between said paired data lines from being increased.

6. A sense amplifier circuit according to claim 1, wherein said second clamping means includes detection means for detecting the amplitude of a voltage between said paired data lines; and controlled type current source means for controlling an amount of current flowing in said paired data lines in response to an output of said detecting means to supply a large amount of compensation current to one of said paired data lines which is set at a lower potential and supply a small amount of compensation current to the other of said paired data lines which is set at a higher potential.

7. A sense amplifier circuit according to claim 1, wherein said second clamping means is arranged on said paired data lines and in position farthest from said common load means.

8. A sense amplifier circuit according to claim 1, wherein said first clamping means is connected to one end of said paired data lines and said second clamping means is connected to the other end of said paired data lines.

9. A sense amplifier circuit according to claim 1, wherein said second clamping means includes a pair of bipolar transistors whose bases are respectively connected to said paired data lines and whose emitters are connected together; a constant current source circuit connected between the emitter common connection node of said pair of bipolar transistors and a first potential supplying source; and first and second current mirror circuits having input terminals respectively connected to the collectors of said pair of bipolar transistors and output terminals respectively connected to said paired data lines, and the collectors and bases of said pair of bipolar transistors are cross-coupled via said first and second current mirror circuits.

10. A sense amplifier circuit according to claim 1, wherein said second clamping means includes paired diodes having cathodes connected together and anodes respectively connected to said paired data lines; a first constant current source circuit connected between the cathode common connection node of said paired diodes and a first potential supplying source; a second constant current source circuit connected between a second potential supplying source and one of said paired data lines; and a third constant current source circuit connected between said second potential supplying source and the other of said paired data lines.

11. A sense amplifier circuit comprising:

a plurality of first amplifier means for receiving potentials of a plurality of pairs of bit lines at input terminals thereof and subjecting the potentials of the bit line pairs to a differential amplification;

paired data lines connected to said plurality of first amplifier means;

second amplifier means connected to said paired data lines, for amplifying the potential which is subjected to the differential amplification by said plurality of first amplifier means and then output to said paired data lines; and clamping means for reducing the amplitude of a voltage between said paired data lines;

wherein said clamping means includes detection means for detecting the amplitude of a voltage between said paired data lines; and controlled type current source means for controlling an amount of current flowing in said paired data lines in response to an output of said detecting means to prevent the amplitude of the voltage between said paired data lines from being increased.

12. A sense amplifier circuit according to claim 11, wherein each of said plurality of first amplifier means includes a first bipolar transistor having a collector connected to one of said paired data lines and a base connected to one of said bit lines of a corresponding pair; a second bipolar transistor having a collector connected to the other of said paired data lines, a base connected to the other of said bit lines of said corresponding pair and an emitter connected to an emitter of said first bipolar transistor; and a MOSFET having a current path connected between the emitters of said first and second bipolar transistors and a ground terminal and a gate supplied with a control signal.

13. A sense amplifier circuit according to claim 11, wherein said second amplifier means includes a pair of load resistors connected between said paired bit lines and a first potential supplying source and acting as a common load of said plurality of first amplifier means; and a pair of bipolar transistors having collector-emitter paths connected between said pair of load resistors and said paired data lines and bases supplied with a reference potential.

14. A sense amplifier circuit according to claim 11, wherein said second amplifier means includes a pair of first load resistor means connected between said paired bit lines and a first potential supplying source and acting as a common load of said plurality of first amplifier means; a pair of bipolar transistors having bases respectively supplied with currents corresponding to potentials at connection nodes between said paired bit lines and said paired load means and emitters connected together; a current source connected between the emitter common connection node of said pair of bipolar transistors and a second potential supplying source; and a pair of load elements respectively connected between the collectors of said pair of bipolar transistors and said first potential supplying source.

15. A sense amplifier circuit according to claim 11, wherein said controlled type current source means controls the amount of current flowing in said paired data lines in response to an output of said detecting means to supply a large amount of compensation current to one of said paired data lines which is set at a lower potential and supply a small amount of compensation current to the other said paired data lines which are set at a higher potential.

16. A sense amplifier circuit according to claim 13, wherein said clamping means is arranged on said paired data lines and in position farthest from said common load.

17. A sense amplifier circuit according to claim 11, wherein said second amplifier means is connected to one end of said paired data lines and said clamping means is connected to another end of said paired data lines.

18. A sense amplifier circuit according to claim 11, wherein said clamping means includes a pair of bipolar transistors whose bases are respectively connected to said paired data lines and whose emitters are connected together; a constant current source circuit connected between the emitter common connection node of said pair of bipolar transistors and a first potential supplying source; and first and second current mirror circuits having input terminals respectively connected to the collectors of said pair of bipolar transistors and output terminals respectively connected to said paired data lines, and the collectors and bases of said pair of bipolar transistors are cross-coupled via said first and second current mirror circuits.

19. A sense amplifier circuit according to claim 1, wherein said clamping means includes paired diodes having cathodes connected together and anodes respectively connected to said paired data lines; a first constant current source circuit connected between the cathode common connection node of said paired diodes and a first potential supplying source; a second constant current source circuit connected between a second potential supplying source and one of said paired data lines; and a third constant current source circuit connected between said second potential supplying source and the other of said paired data lines.

* * * * *

UNITED STATES PATENT AND TRADEMARK OFFICE
CERTIFICATE OF CORRECTION

PATENT NO. : 5,331,233
DATED : July 19, 1994
INVENTOR(S) : Yukihiro URAKAWA

It is certified that error appears in the above-indentified patent and that said Letters Patent is hereby corrected as shown below:

Claim 19, column 12, line 40 change "1" to --11--.

Signed and Sealed this

Second Day of May, 1995

Attest:

BRUCE LEHMAN

Attesting Officer     Commissioner of Patents and Trademarks